United States Patent
Balboni

(10) Patent No.: US 8,174,318 B2
(45) Date of Patent: May 8, 2012

(54) APPARATUS AND METHOD FOR PROVIDING LINEAR TRANSCONDUCTANCE AMPLIFICATION

(75) Inventor: Edmund Balboni, Littleton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/834,278

(22) Filed: Jul. 12, 2010

(65) Prior Publication Data

US 2011/0181359 A1    Jul. 28, 2011

Related U.S. Application Data

(60) Provisional application No. 61/299,321, filed on Jan. 28, 2010.

(51) Int. Cl.
*H03F 3/45* (2006.01)

(52) U.S. Cl. ........................... 330/253; 330/252
(58) Field of Classification Search .................. 330/252, 330/253

See application file for complete search history.

(56) References Cited

U.S. PATENT DOCUMENTS

| | | | |
|---|---|---|---|
| 5,343,163 A * | 8/1994 | Linder et al. | 330/252 |
| 5,399,988 A * | 3/1995 | Knierim | 330/252 |
| 6,448,854 B1 | 9/2002 | Kimura | |
| 2005/0030121 A1 | 2/2005 | Gilbert | |

OTHER PUBLICATIONS

Analog Devices, "500 MHz to 1500 MHz Quadrature Modulator," ADL5371, Jan. 2007.
Analog Devices, "400 MHz to 6GHz Broadband Quadrature Modulator," ADL5375, Nov. 2008.
Barrie Gilbert, The Micromixer: A Highly Linear Variant of the Gilbert Mixer Using a Bisymmetric Class-AB Input Stage, IEEE Journal of Solid State Circuits, vol. 32, No. 9, Sep. 1997, pp. 1412-1423.
U.S. Appl. No. 61/299,321, filed Jan. 28, 2010, Balboni et al.

* cited by examiner

*Primary Examiner* — Khanh Nguyen
(74) *Attorney, Agent, or Firm* — Knobbe Martens Olson & Bear LLP

(57) ABSTRACT

Apparatus and methods are disclosed, such as those involving a transconductance amplifier. One such apparatus includes a transconductance amplifier comprising an input to receive an input voltage signal, and an output to provide an output current signal at least partly in response to the input voltage signal. The apparatus also includes a linearizer configured to remove non-linearity in the output current signal such that the output current signal is substantially linear when the input voltage signal is within a range; and a current booster configured to add a current to the output current signal such that the output current signal is substantially linear when the input voltage signal is outside the range. The current booster allows the amplifier to have a linear response to a larger voltage swing without adding noise.

21 Claims, 9 Drawing Sheets

APPARATUS AND METHOD FOR PROVIDING LINEAR TRANSCONDUCTANCE AMPLIFICATION

CROSS-REFERENCE TO RELATED APPLICATIONS

This application is related to U.S. Provisional Application No. 61/299,321, filed Jan. 28, 2010, the entire disclosure of which is incorporated herein by reference.

BACKGROUND

1. Field

Embodiments of the invention relate to electronic devices, and more particularly, in one or more embodiments, to transconductance amplifiers.

2. Description of the Related Technology

Certain electronic devices employ amplifiers to process signals for transmission to an external device or further processing within the devices. Such amplifiers receive an input signal, and generate an output signal having gain in comparison to the input signal. Due to the non-linear characteristics of the electronic components used in the amplifiers, the amplifiers typically do not provide a linear response. In other words, the output signal is typically not linearly proportional to the input signal.

Among such amplifiers, transconductance amplifiers receive a voltage signal as an input signal, and provide a current signal as an output signal. Transconductance amplifiers can also have non-linearity in their transfer characteristics.

SUMMARY

In one embodiment, an apparatus includes a transconductance amplifier having an input configured to receive an input voltage signal and having an output configured to generate an output current signal at least partly in response to the input voltage signal; a linearizer configured to remove non-linearity in the output current signal such that the output current signal is substantially linear when the input voltage signal is within a range; and a current booster configured to add a current to the output current signal such that the output current signal remains substantially linear when the input voltage signal is outside the range.

In another embodiment, an electronic device includes a transconductance amplifier. The amplifier includes: a first transistor configured to convert an input voltage signal into an output current signal, wherein the output current signal comprises an undistorted component and distortion terms; a second transistor configured to provide a cancellation current to the output current signal such that at least one distortion term of the distortion terms is substantially cancelled out when the input voltage signal is within a first input voltage range; and a third transistor configured to provide an additional current to the output current signal such that the response of the amplifier remains linear outside the first input voltage range.

In yet another embodiment, a method for linearizing an amplifier includes: converting, by a transistor, an input voltage signal into an output current signal, wherein the output current signal contains non-linearity relative to the input voltage signal; cancelling, by a linearizer, the non-linearity of the output current signal such that the output current signal is linear when the input voltage signal is within a first voltage range; and linearizing the output current signal when the input voltage signal is outside the first voltage range.

In yet another embodiment, an apparatus includes: means for converting an input voltage signal into an output current signal, wherein the output current signal contains non-linearity relative to the input voltage signal; means for cancelling the non-linearity of the output current signal such that the output current signal is linear when the input voltage signal is within a first voltage range; and means for linearizing the output current signal when the input voltage signal is outside the first voltage range.

DETAILED DESCRIPTION OF EMBODIMENTS

Figure 1:
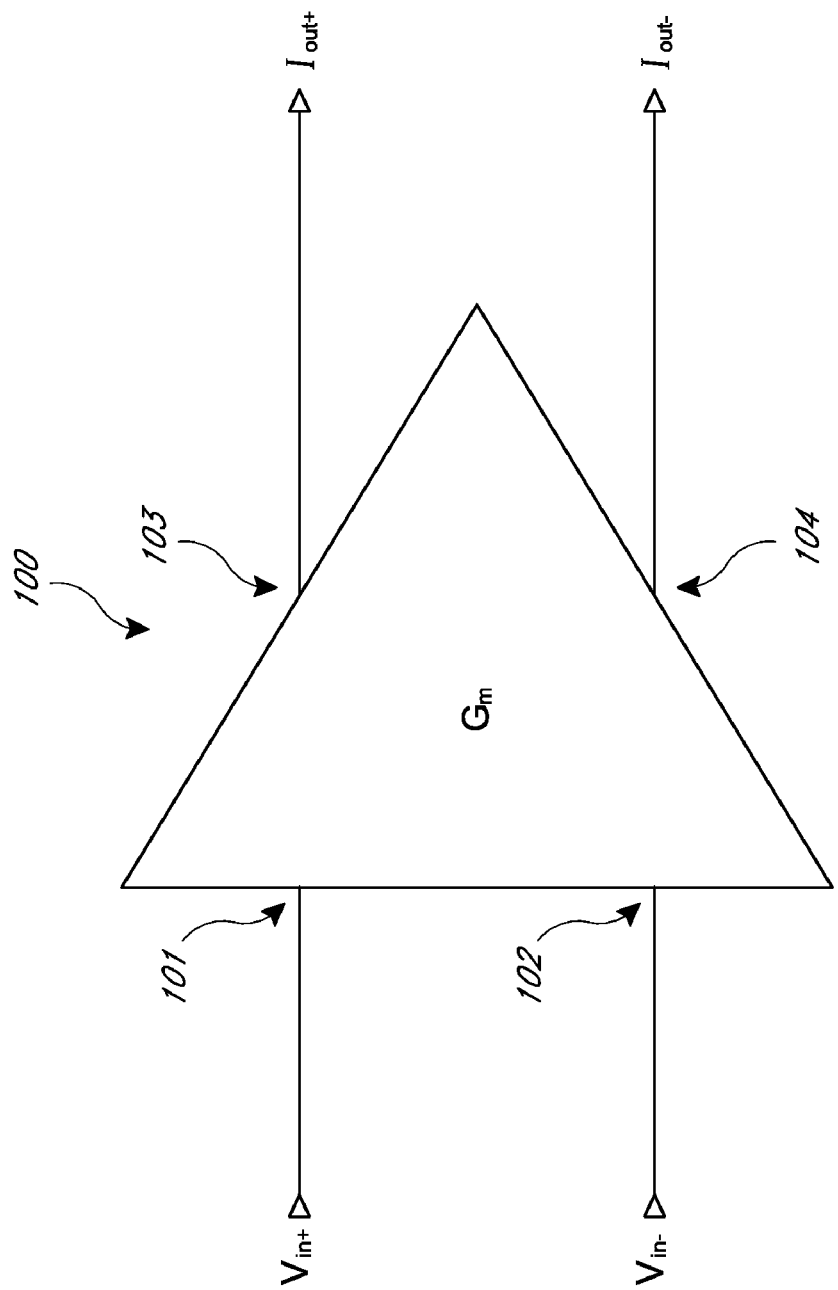
FIG. 1 illustrates a symbol for a transconductance amplifier for differential signaling.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Transconductance Amplifiers

A transconductance amplifier is an amplifier in which an input voltage is amplified into an output current. Thus, the term "transconductance amplifier" can also be referred to as a "voltage-controlled current source" or "voltage-to-current converter." A transconductance amplifier can be used in various applications, for example, variable frequency oscillators and filters, and variable gain amplifier stages.

FIG. 1 illustrates a symbol for a transconductance amplifier used for differential signaling. Differential signaling is a method of transmitting information using two complementary signals sent on two separate lines. The illustrated transconductance amplifier 100 includes a first voltage input 101, a second voltage input 102, a first current output 103, and a second current output 104. The transconductance amplifier 100 receives a differential voltage signal $V_{in+}$, $V_{in-}$ at the inputs 101, 102, and outputs a differential current signal $I_{out+}$, $I_{out-}$ from the outputs 103, 104.

Figure 2:
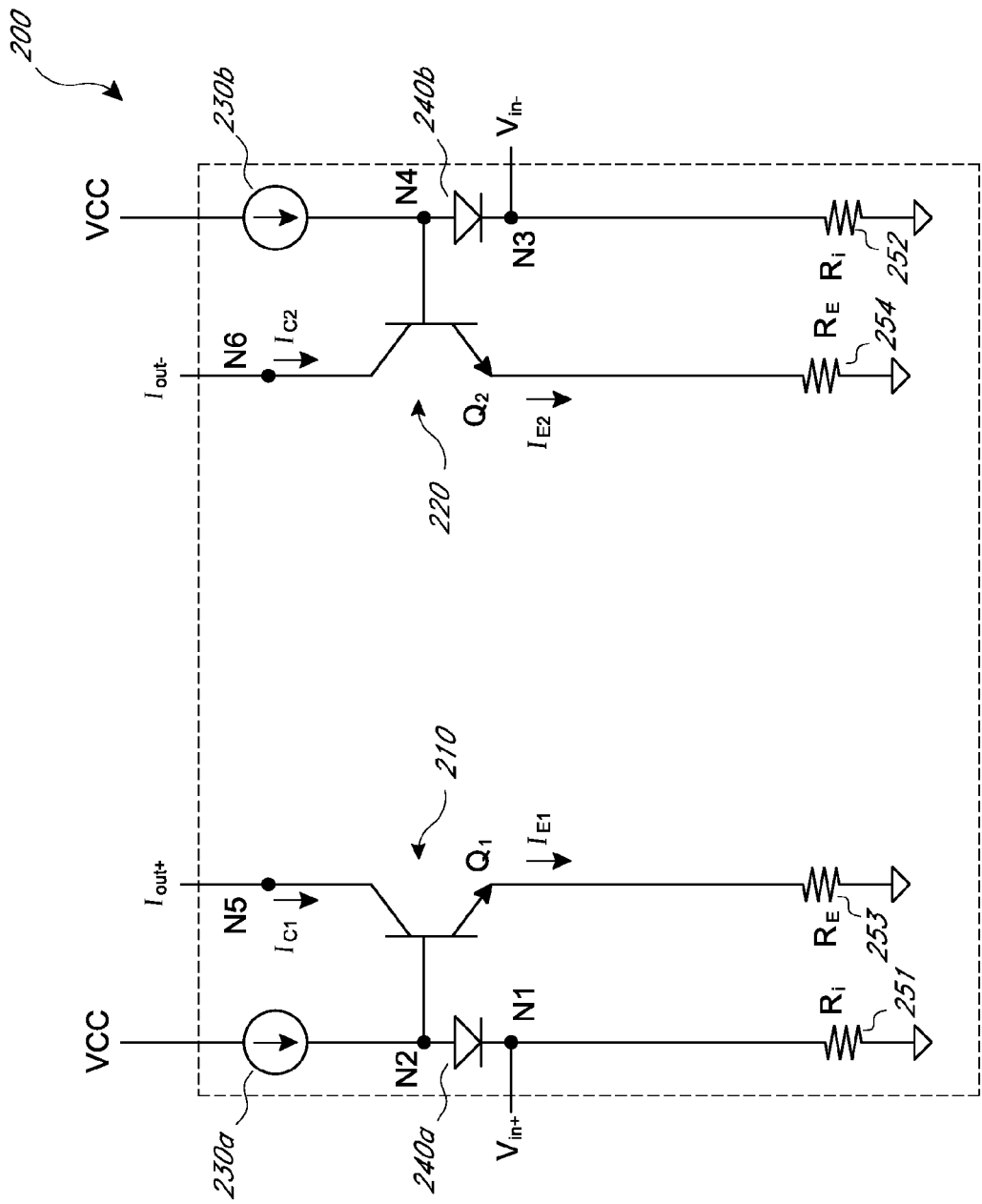
FIG. 2 is a schematic circuit diagram of a conventional transconductance amplifier.

Referring to FIG. 2, a conventional transconductance amplifier will be described below. The illustrated transconductance amplifier 200 includes a first transistor ($Q_1$) 210, a second transistor ($Q_2$) 220, first and second current sources 230a, 230b, first and second diodes 240a, 240b, a first resistor 251, a second resistor 252, a third resistor 253, a fourth resistor 254, and first to sixth nodes N1-N6.

The first transistor 210 includes an emitter electrically coupled to a first end of the third resistor 253, a base electrically coupled to the second node N2, and a collector electrically coupled to the fifth node N5 for outputting a first output current $I_{out+}$. The second transistor 220 includes an emitter electrically coupled to a first end of the fourth resistor 254, a base electrically coupled to the fourth node N4, and a collector electrically coupled to the sixth node N6 for outputting a second output current $I_{out-}$. The first and second output currents $I_{out+}$, $I_{out-}$ together form a differential current signal. The first and second transistors 210, 220 can have a relatively high beta ($\beta$) value, that is, a high ratio of collector current to base current (Ic/Ib). For example, $\beta$ of each of the transistors 210, 220 can be between about 50 and about 150.

The first current source 230a has an input electrically coupled to a voltage source Vcc, and an output electrically coupled to the second node N2, and provides a first bias current to the second node N2. The second current source 230b has a cathode electrically coupled to the voltage source Vcc, and an anode electrically coupled to the fourth node N4, and provides a second bias current to the fourth node N4.

The first diode 240a has an anode electrically coupled to the second node N2, and a cathode electrically coupled to the first node N1, which receives a non-inverted portion $V_{in+}$ of the differential voltage signal (or alternatively referred to as "first voltage input" or "first input voltage signal"). The second diode 240b has an anode electrically coupled to the fourth node N4, and a cathode electrically coupled to the third node N3, which receives an inverted portion $V_{in-}$ of the differential voltage signal (or alternatively referred to as "second voltage input" or "second input voltage signal").

The first resistor 251 has a first end electrically coupled to the first node N1, and a second end electrically coupled to a common voltage reference, such as ground. The second resistor 252 has a first end electrically coupled to the third node N3, and a second end electrically coupled to the common voltage reference. The first and second resistors 251, 252 can have substantially the same resistance $R_i$ as each other.

The first and second resistors 251, 252 can work with the current sources 230a, 230b to set the input voltage signals $V_{in+}$, $V_{in-}$ for applications where the input voltage signals $V_{in+}$, $V_{in-}$ to the amplifier 200 are DC blocked. In one embodiment, the currents from the current sources 230a, 230b can be about 1 mA, and the input common mode voltage can be about 0.5 V. In such an embodiment, the resistance $R_i$ can be about 500Ω. In other embodiments, a wide range of current sources and resistors can be used for the current sources 230a, 230b, and the resistors 251, 252, respectively. Smaller currents can cause a greater sensitivity to the $\beta$ of the first and second transistor 210, 220 while larger currents can be wasteful (inefficient). In certain embodiments, the resistance $R_i$ can be, for example, between about 50Ω and about 5,000Ω. In such embodiments, the current sources 230a, 230b need to be scaled, depending on the resistances of the resistors 251, 252.

The third resistor 253 has a first end electrically coupled to the emitter of the first transistor 210, and a second end electrically coupled to the common voltage reference. The fourth resistor 254 has a first end electrically coupled to the emitter of the second transistor 220, and a second end electrically coupled to the common voltage reference. The third and fourth resistors 253, 254 can have substantially the same resistance $R_E$ as each other.

As the resistance $R_E$ becomes smaller, the transconductance $g_m$ of the amplifier 200 increases (the transconductance $g_m$ is approximately $I_{out}/V_{in}=1/R_E$). In one embodiment, the resistance $R_E$ can be, for example, about 50Ω, as smaller values may require too much supply current while larger values are too noisy. In other embodiments, the resistance $R_E$ can be between about 40Ω and about 500Ω.

During operation, the amplifier 200 receives the first voltage input $V_{in+}$ and the second voltage input $V_{in-}$ at the first and third nodes N1, N3, respectively. The first and second voltage inputs $V_{in+}$, $V_{in-}$ together form a differential signal. Each of the first and second diodes 240a, 240b, while passing a current from a respective one of the current sources 230a, 230b, generates a voltage drop between its anode and cathode.

The first transistor 210 has a base-emitter voltage drop that is substantially the same as the voltage drop generated by the first diode 240a. The first transistor 210 generates an emitter current from its emitter, depending on the voltage drop.

The first transistor 210 has a non-linear internal resistance between its base and emitter. The internal resistance is a function of the emitter current, and can result in a small loss in the emitter current, which can cause non-linearity in the emitter current. As the first transistor 210 has a relatively high $\beta$ value, the first output current $I_{out+}$ from the collector of the transistor 210 (that is, the collector current $I_{C1}$ of the transistor 210) is substantially the same as the emitter current $I_{E1}$ of the first transistor 210, thereby reflecting the non-linearity of the emitter current $I_{E1}$.

Similarly, the second transistor 220 has a base-emitter voltage drop that is substantially the same as the voltage drop generated by the second diode 240b. The second transistor 220 generates an emitter current from its emitter, depending on the voltage drop. The second transistor 220 also has an internal resistance between its base and emitter, which can cause non-linearity in the emitter current. As the second transistor 220 also has a relatively high $\beta$ value, the second output current $I_{out-}$ from the collector of the transistor 220 (that is, the collector current $I_{C2}$ of the transistor 220) is substantially the same as the emitter current $I_{E2}$ of the second transistor 220, thereby reflecting the non-linearity of the emitter current $I_{E2}$.

As described above, the internal resistance of the transistors 210, 220 can cause non-linearity in response, which can adversely affect the operation of other components that use the output currents of the amplifier 200. Such non-linearity can be characterized by a polynomial expansion. In theory, the polynomial expansion can be expanded into multiple orders (for example, second, third, fourth, and fifth orders, etc.). It has been recognized that the third-order distortion term has a higher amplitude than other distortion terms. Further, the third-order distortion term tends to be closer in frequency to the fundamental signal (or the signal of interest) than other distortion terms. As the third-order distortion term is closely spaced from the signal of interest, it is difficult to filter. Thus the third-order distortion term is often a dominant distortion term. Thus, there have been attempts to remove or cancel the third-order distortion term to reduce the overall non-linearity of the amplifier 200.

Figure 3:
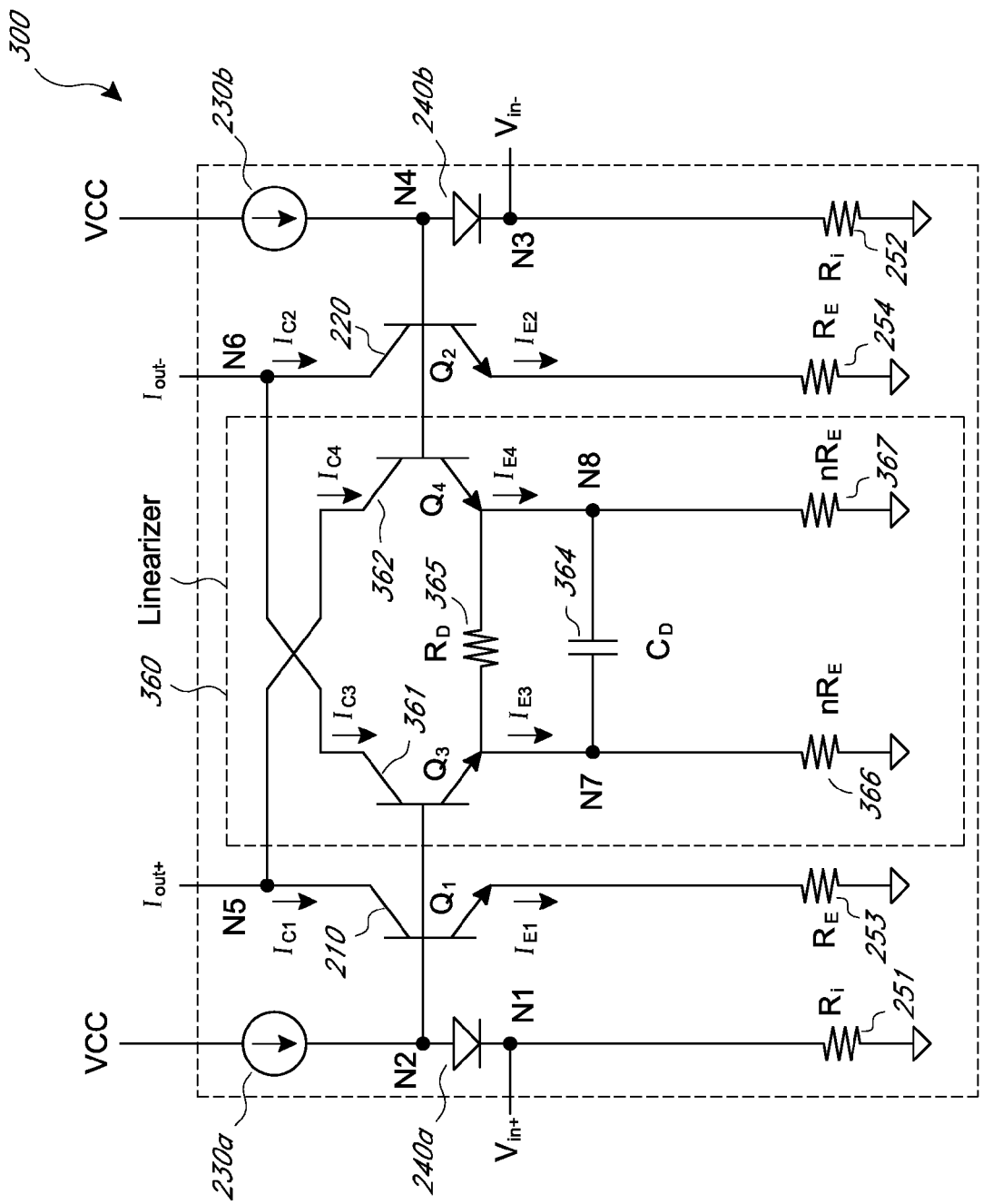
FIG. 3 is a schematic circuit diagram of an example transconductance amplifier having a linearizer.

FIG. 3 illustrates an example transconductance amplifier co-invented by the inventor of the present application, which has been disclosed by U.S. Provisional Application No. 61/299,321, filed Jan. 28, 2010, the entire disclosure of which is incorporated herein by reference.

The illustrated transconductance amplifier 300 includes a first transistor ($Q_1$) 210, a second transistor ($Q_2$) 220, first and second current sources 230a, 230b, first and second diodes 240a, 240b, a first resistor 251, a second resistor 252, a third resistor 253, a fourth resistor 254, and first to sixth nodes N1-N6. The details of the foregoing components can be as described above in connection with those of FIG. 2.

The transconductance amplifier 300 is further provided with a linearizer 360 to cancel the third-order distortion term of the collector currents of the first and second transistors 210, 220 to remove or reduce non-linearity. The linearizer 360 can include a third transistor ($Q_3$) 361, a fourth transistor ($Q_4$) 362, a first capacitor 364, a fifth resistor 365, a sixth resistor 366, a seventh resistor 367, and seventh and eighth nodes N7, N8.

The third transistor 361 includes an emitter electrically coupled to the seventh node N7, a base electrically coupled to the second node N2, and a collector electrically coupled to the sixth node N6. The fourth transistor 362 includes an emitter electrically coupled to the eighth node N8, a base electrically coupled to the fourth node N4, and a collector electrically coupled to the fifth node N5.

The first capacitor 364 has a first terminal electrically coupled to the seventh node N7, and a second terminal electrically coupled to the eighth node N8. The first capacitor 364 can have a capacitance $C_D$, for example, between about 50 fF and about 500 fF. The capacitance $C_D$ can be chosen to match the phase of the currents from the linearizer 360 with that of the output currents $I_{out+}$, $I_{out-}$.

The fifth resistor 365 has a first end electrically coupled to the seventh node N7, and a second end electrically coupled to the eighth node N8. The fifth resistor 365 can have a resistance $R_D$ which can be selected to provide the particular transconductance of the linearizer 360. In one embodiment, the resistance $R_D$ can be about 10 to 30 times the resistance $R_E$ of the third and fourth resistors 253, 254. In an embodiment in which the resistance $R_E$ is about 50Ω, $R_D$ can be, for example, between about 500Ω and about 1,500Ω.

The sixth resistor 366 has a first end electrically coupled to the seventh node N7, and a second end electrically coupled to the common voltage reference. The seventh resistor 367 has a first end electrically coupled to the eighth node N8, and a second end electrically coupled to the common voltage reference. Each of the sixth and seventh resistors 366, 367 can have a resistance $nR_E$, which can be about n times the resistance $R_E$ of one of the third and fourth resistors 253, 254. The value of n can be greater than 1, for example, between about 10 and about 30. For example, the resistance $nR_E$ can be between about 500Ω and about 1500Ω.

The resistance $nR_E$ and the resistance $R_D$ of the fifth to seventh resistors 365, 366, 367 set the differential transconductance of the linearizer 360. The differential transconductance set by these resistors 365, 366, 367 can be chosen to be approximately 1/10 the transconductance of the amplifier (hereinafter, alternatively referred to as "main amplifier") formed by the first and second transistors 210, 220, and the third and fourth resistors 253, 254. The bias currents of the third and fourth transistors 361, 362 can be chosen to be approximately 1/30 of the bias currents in the main amplifier. This ratio of transconductance to bias current is close to what is necessary to cancel the third order distortion term.

During operation, the emitter current $I_{E3}$ of the third transistor 361 can be n times smaller than the emitter current $I_{E1}$ of the first transistor 210 because the resistance $nR_E$ of the sixth resistor 366 is n times larger than the resistance $R_E$ of the third resistor 253. As the third transistor 361 has a relatively high β value, the collector current $I_{C3}$ of the third transistor 361 can be substantially the same as the emitter current $I_{E3}$ of the third transistor 361.

Similarly, the emitter current $I_{E4}$ of the fourth transistor 362 can be n times smaller than the emitter current $I_{E2}$ of the second transistor 220 because the resistance $nR_E$ of the seventh resistor 367 is n times larger than the resistance $R_E$ of the fourth resistor 254. As the fourth transistor 362 also has a relatively high β value, the collector current $I_{C4}$ of the fourth transistor 362 can be substantially the same as the emitter current $I_{E4}$ of the fourth transistor 362.

The collector current $I_{C3}$ of the third transistor 361 is provided to the sixth node N6, and summed with the collector current $I_{C2}$ of the second transistor 220. The collector current $I_{C3}$ of the third transistor 361 has an opposite polarity from the collector current $I_{C2}$ of the second transistor 220 because the collector current $I_{C3}$ of the third transistor 361 and the collector current $I_{C2}$ of the transistor 220 are generated in response to the first and second input voltages $V_{in+}$, $V_{in-}$.

In addition, the amplitude of the collector current $I_{C3}$ of the third transistor 361 is about n times smaller than that of the collector current $I_{C2}$ of the second transistor 220. The value of n can be chosen to make the amplitude of the collector current $I_{C3}$ (or a distortion current) of the third transistor 361 substantially the same as that of the third order distortion term of the collector current $I_{C2}$ of the second transistor 220.

As such, the collector current $I_{C3}$ of the third transistor 361 can have substantially the same amplitude as and opposite polarity from the third order distortion term of the collector current $I_{C2}$ of the second transistor 220. Thus, the collector current $I_{C3}$ of the third transistor 361 substantially cancels the third order distortion term of the collector current $I_{C2}$ of the second transistor 220 when summed with it at the sixth node N6 to provide the second output current $I_{out-}$. As the third order distortion term of the collector current $I_{C2}$ of the second transistor 220 is cancelled out, the amplifier 300 can provide substantially linear transfer characteristics relative to the second input voltage $V_{in-}$.

The linearizer 360 has much lower transconductance gain and much higher nonlinearity, compared to the main amplifier. Thus, when the currents $I_{C2}$, $I_{C3}$ are combined with each other, the third-order distortion term cancels while only a little of the collector current $I_{C2}$ of the second transistor 220 is lost. For example, around 10% of the collector current $I_{C2}$ can be lost, resulting in a reduction in overall transconductance of about 10%.

Similarly, the collector current $I_{C4}$ of the fourth transistor 362 has substantially the same amplitude as and opposite polarity from the third order distortion term of the collector current $I_{C1}$ of the first transistor 210. Thus, the collector current $I_{C4}$ of the fourth transistor 362 substantially cancels the third order distortion term of the collector current $I_{C1}$ of the first transistor 210 when summed with it at the fifth node N5 to provide the first output current $I_{out+}$. As the third order distortion term of the collector current $I_{C1}$ of the first transistor 210 is cancelled out, the amplifier 300 can provide substantially linear transfer characteristics relative to the first input voltage $V_{in+}$.

Transconductance Amplifier Having Linearizer with Current Booster

In the example described earlier in connection with FIG. 3, the output currents $I_{out+}$, $I_{out-}$ show substantial linearity relative to the input voltages $V_{in+}$, $V_{in-}$ when the input voltages $V_{in+}$, $V_{in-}$ are relatively small, for example, when each of the input voltages $V_{in+}$, $V_{in-}$ is within a range between about −0.15 V and about +0.15 V. Such a range of input voltage, within which the transfer characteristics of an amplifier are linear, can be referred to as a "linear range" in the context of this document. When the input voltages $V_{in+}$, $V_{in-}$ are outside the linear range (for example, when the input voltages $V_{in+}$, $V_{in-}$ are higher than about +0.15 V or lower than about −0.15 V), the output currents $I_{out+}$, $I_{out-}$ tend to exhibit progressively more non-linearity.

As a larger signal swing can improve signal to noise performance, it is desirable to use a larger signal swing. However, such a larger signal swing can introduce non-linear transfer characteristics when the signal swing goes beyond the linear range provided by a linearizer. Thus, there is a need for providing a scheme that can expand the linear range for effectively using a larger signal swing.

In some embodiments, a transconductance amplifier can be provided with a linearizer and a current booster (or alternatively referred to as "boost circuit"). The linearizer can provide linearity within a certain range of an input voltage by providing current(s) to cancel dominant distortion term(s) of output current(s) of the amplifier. The current booster can provide an additional (positive or negative) current to the output current(s) of the amplifier such that the addition current improves linearity of the amplifier's response outside the certain range provided by the linearizer.

Figure 4A:
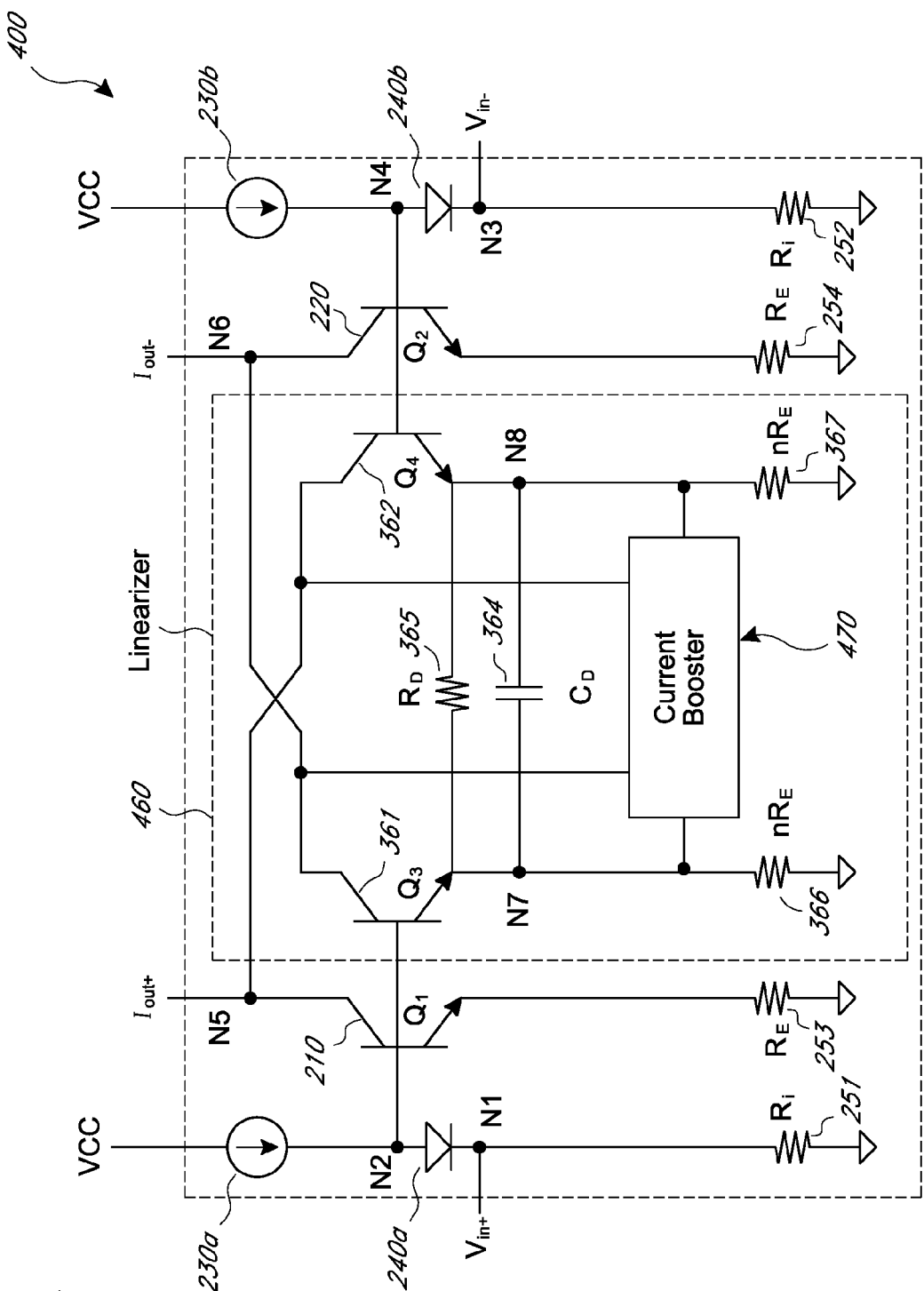
FIG. 4A is a schematic circuit diagram of a transconductance amplifier having a linearizer with a current booster according to one embodiment.

Referring to FIG. 4A, one embodiment of a transconductance amplifier having a linearizer and a current booster will be described below. The illustrated transconductance amplifier 400 includes a first transistor ($Q_1$) 210, a second transistor ($Q_2$) 220, first and second current sources 230a, 230b, first and second diodes 240a, 240b, a first resistor 251, a second resistor 252, a third resistor 253, a fourth resistor 254, and first to sixth nodes N1-N6. The details of these components can be as described earlier in connection with those of FIG. 2. In the embodiments described herein, each of transistors in circuits is described as an NPN bipolar transistor. However, a skilled artisan will appreciate that the circuits can be modified such that one or more of such transistors can be replaced with a PNP bipolar transistor, an NMOS transistor, a PMOS transistor, a GaAs heterojunction bipolar transistor (HBT), or a pseudomorphic high electron mobility transistor (pHempt) while providing the same advantages and functionality.

Figure 4B:
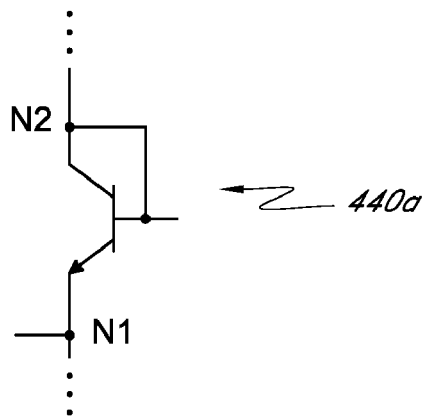
FIG. 4B is a schematic circuit diagram of a diode-connected transistor that can replace a diode of FIG. 4A according to another embodiment.
Figure 4C:
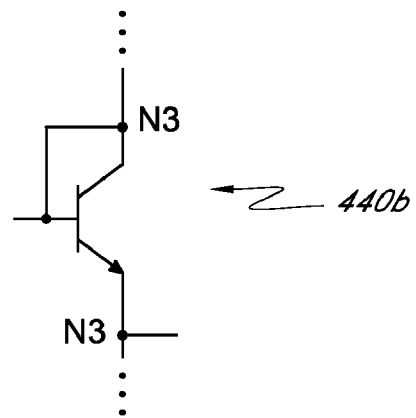
FIG. 4C is a schematic circuit diagram of a diode-connected transistor that can replace a diode of FIG. 4A according to another embodiment.

In another embodiment, the first and second diodes 240a, 240b can be replaced with first and second diode-connected transistors 440a, 440b, as shown in FIGS. 4B and 4C, respectively. In FIG. 4B, the first diode-connected transistor 440a has an emitter electrically coupled to the first node N1, a base electrically coupled to the second node N2, and a collector electrically coupled to the second node N2. In FIG. 4C, the second diode-connected transistor 440b has an emitter electrically coupled to the third node N3, a base electrically coupled to the fourth node N4, and a collector electrically coupled to the fourth node N4.

The transconductance amplifier 400 is further provided with a linearizer 460 to cancel, for example, the third-order distortion term of the collector currents of the first and second transistors 210, 220 to remove or reduce non-linearity. The linearizer 360 can include a third transistor ($Q_3$) 361, a fourth transistor ($Q_4$) 362, a first capacitor 364, a fifth resistor 365, a sixth resistor 366, a seventh resistor 367, and seventh and eighth nodes N7, N8. The details of the foregoing components of the linearizer 460 can be as described above in connection with those of the linearizer 360 of FIG. 3.

Figure 4D:
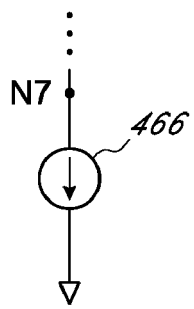
FIG. 4D is a schematic circuit diagram of a current source that can replace a resistor of FIG. 4A according to another embodiment.
Figure 4E:
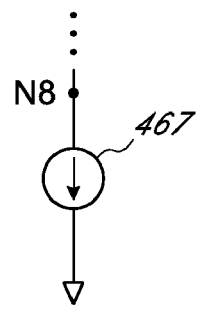
FIG. 4E is a schematic circuit diagram of a current source that can replace a resistor of FIG. 4A according to another embodiment.

In another embodiment, the linearizer 460 may not include the first capacitor 364. In yet another embodiment, the sixth and seventh resistors 366, 367 can be replaced with current sources 466, 467, as shown in FIGS. 4D and 4E, respectively.

The transconductance amplifier 400 is also provided with a current booster 470 that can expand the linear range of the amplifier to accommodate a larger signal swing. The current booster 470 can have inputs electrically coupled to the seventh and eighth nodes N7, N8, and outputs electrically coupled to the fifth and sixth nodes N5, N6. The current booster 470 can be configured to remain off or to provide a relatively small current when the input voltages $V_{in+}$, $V_{in-}$ are small enough to be within the linear range that can be provided by the linearizer 460. In other words, the current booster 470 does not function when the linearizer, by itself, can provide linearity to the output currents $I_{out+}$, $I_{out-}$.

However, when the input voltages $V_{in+}$, $V_{in-}$ rise above or fall below the linear range provided by the linearizer 460, the current booster 470 can function to provide more current to cancel the dominant distortion term (for example, the third-order distortion term) of one or more of the collector currents of the first and second transistors 210, 220.

In the illustrated embodiment, the current booster 470 is used in conjunction with the specific linearizer 460 shown in FIG. 4. However, a skilled artisan will appreciate that the configurations and principles of the embodiment can apply for any suitable linearizer having a limited linear range, thereby expanding the linear range for a larger signal swing.

Figure 5A:
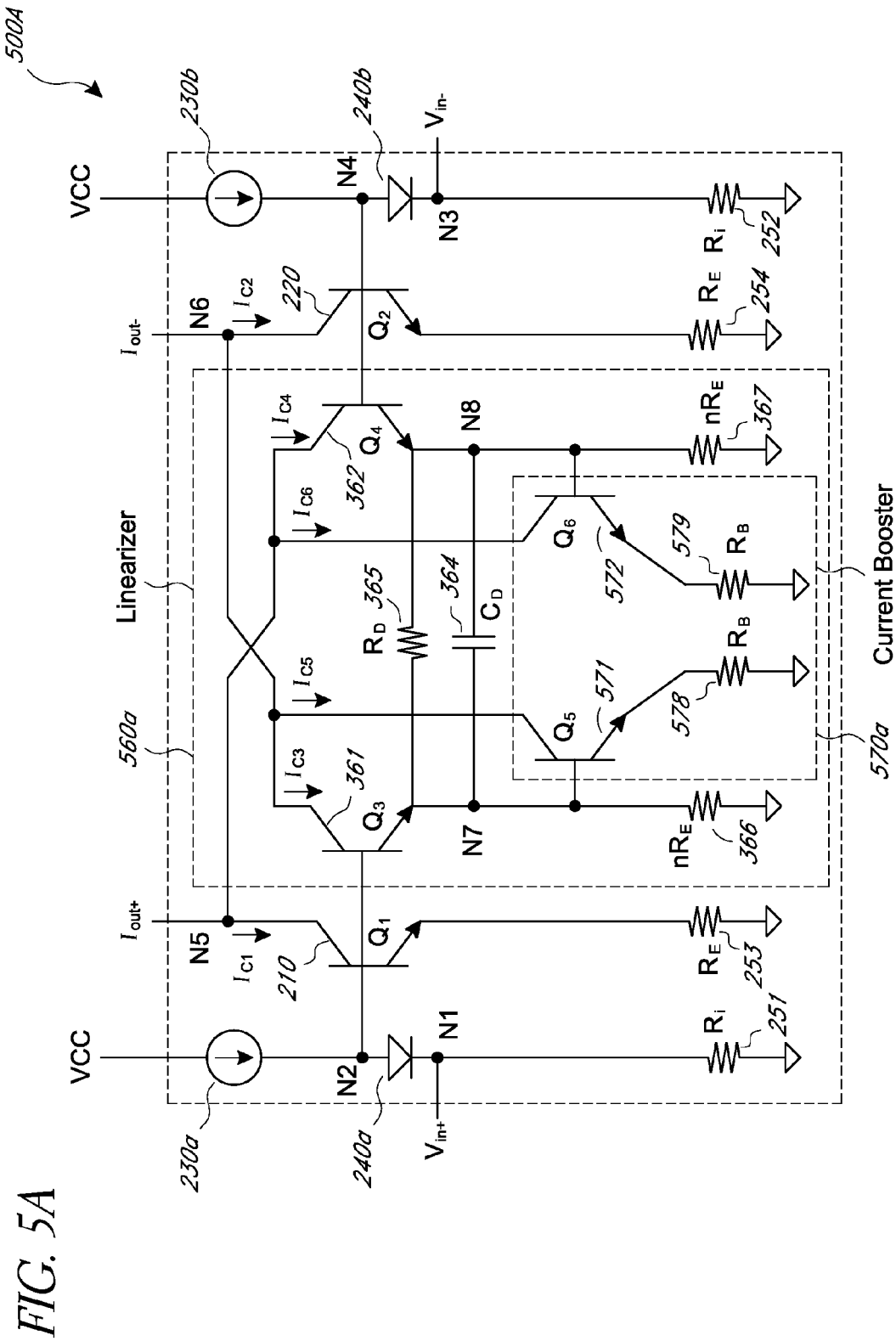
FIG. 5A is a schematic circuit diagram of a transconductance amplifier having a linearizer with a current booster according to another embodiment.

Referring to FIG. 5A, another embodiment of a transconductance amplifier having a linearizer and a current booster will be described below. The illustrated transconductance amplifier 500A includes first and second transistors ($Q_1$, $Q_2$) 210, 220, first and second current sources 230a, 230b, first and second diodes 240a, 240b, first to fourth resistors 251-254, and first to sixth nodes N1-N6. The details of the foregoing components can be as described above in connection with those of FIG. 4.

The transconductance amplifier 500A is further provided with a linearizer 560a to cancel the third-order distortion term of the collector currents of the first and second transistors 210, 220 to remove or reduce non-linearity. The linearizer 560a can include a third transistor ($Q_3$) 361, a fourth transistor ($Q_4$) 362, a first capacitor 364, fifth to seventh resistors 365-367, and seventh and eighth nodes N7, N8. The details of the foregoing components of the linearizer 560a can be as described above in connection with those of the linearizer 460 of FIG. 4.

The transconductance amplifier 500A is also provided with a current booster 570a that can expand the linear range to accommodate a larger signal swing. The illustrated current booster 570a includes a fifth transistor ($Q_5$) 571, a sixth transistor ($Q_6$) 572, an eighth resistor 578, and a ninth resistor 579.

The fifth transistor 571 has an emitter electrically coupled to a first end of the eighth resistor 578, a base electrically coupled to the seventh node N7, and a collector electrically coupled to the sixth node N6. The sixth transistor 572 has an emitter electrically coupled to a first end of the ninth resistor 579, a base electrically coupled to the eighth node N8, and a collector electrically coupled to the fifth node N5.

The eighth resistor 578 has the first end electrically coupled to the emitter of the fifth transistor 571, and a second end electrically coupled to the common voltage reference. The ninth resistor 579 has the first end electrically coupled to the emitter of the sixth transistor 572, and a second end electrically coupled to the common voltage reference.

As the bases of the fifth and sixth transistors 571, 572 are coupled to the seventh and eighth node N7, N8, respectively, voltages provided to the bases of the fifth and sixth transistors 571, 572 are only a fraction of the input voltages $V_{in+}$, $V_{in-}$. For example, the input voltages $V_{in+}$, $V_{in-}$ can include a differential voltage signal between about −0.5 V and +0.5 V, and a common mode voltage signal of about +0.5 V. When the differential voltage signal is small, the fifth and sixth transistors 571, 572 are "off," and have no effect on the amplifier 500A. In order to turn on either of these transistors 571, 572, a voltage of, for example, about 0.7 V is required at either of the seventh and sixth nodes N7, N8. As the common mode voltage is about +0.5 V, a differential voltage signal having +/−0.2 V turns on one of the fifth or sixth transistor 571, 572.

During operation, while the differential voltage signal of the input voltages $V_{in+}$, $V_{in-}$ transition within a relatively small range (for example, between about +0.15 V and −0.15 V), the base-emitter voltage of each of the fifth and sixth transistors 571, 572 is also relatively small. Thus, the fifth and sixth transistors 571, 572 remain off (or slightly turn on) such that the linearity is provided substantially solely by the linearizer 560a.

However, the amplifier 500A may receive a relatively large voltage swing, for example, between about 0 V and about +1.0 V (or a differential voltage swing from about −1.0 V to about +1.0 V). In such an instance, each of the input voltages $V_{in+}$, $V_{in-}$ can transition outside the linear range provided by the linearizer 560a for at least some duration.

When the input voltages $V_{in+}$, $V_{in-}$ transition outside the range, either of the fifth and sixth transistors 571, 572 is turned on. For example, when the first input voltage $V_{in+}$ rises beyond, for example, about +0.65 V (or +0.15 V above the 0.5 V common mode voltage), the seventh node N7 is pulled up such that the fifth transistor 571 is turned on. In that instance, the second input voltage $V_{in-}$ falls below, for example, about +0.35 V (or −0.15 V relative to the +0.5 V common mode voltage), and thus the eighth node N8 is also pulled down, thereby keeping the sixth transistor 572 off.

For another example, when the second input voltage $V_{in-}$ rises beyond, for example, about +0.65 V (or +0.15 V above the 0.5 V common mode voltage), the eight node N8 is pulled up such that the sixth transistor 572 is turned on. In that instance, the first input voltage $V_{in+}$ falls below, for example, +0.35 V (or −0.15 V relative to the +0.5 V common mode voltage), and thus the seventh node N7 is also pulled down, thereby keeping the fifth transistor 571 off.

When either of the fifth and sixth transistors 571, 572 is turned on, as set forth above, the transistor provides an additional current to cancel a distortion term of the collector current of one of the first and second transistors 210, 220. For example, when the fifth transistor 571 is turned on, the collector current $I_{C5}$ of the fifth transistor 571 is provided to the sixth node N6. The collector current $I_{C5}$ of the fifth transistor 571 makes the second output current $I_{out-}$ more negative, thereby improving the linearity, as will be better understood from description below in connection with FIGS. 6A and 6B.

Similarly, when the sixth transistor 572 is turned on, the collector current $I_{C6}$ of the sixth transistor 572 is provided to the fifth node N5. The collector current $I_{C6}$ of the sixth transistor 572 makes the first output current $I_{out+}$ more negative, thereby improving the linearity, as will be better understood from description below in connection with FIGS. 6A and 6B.

Figure 5B:
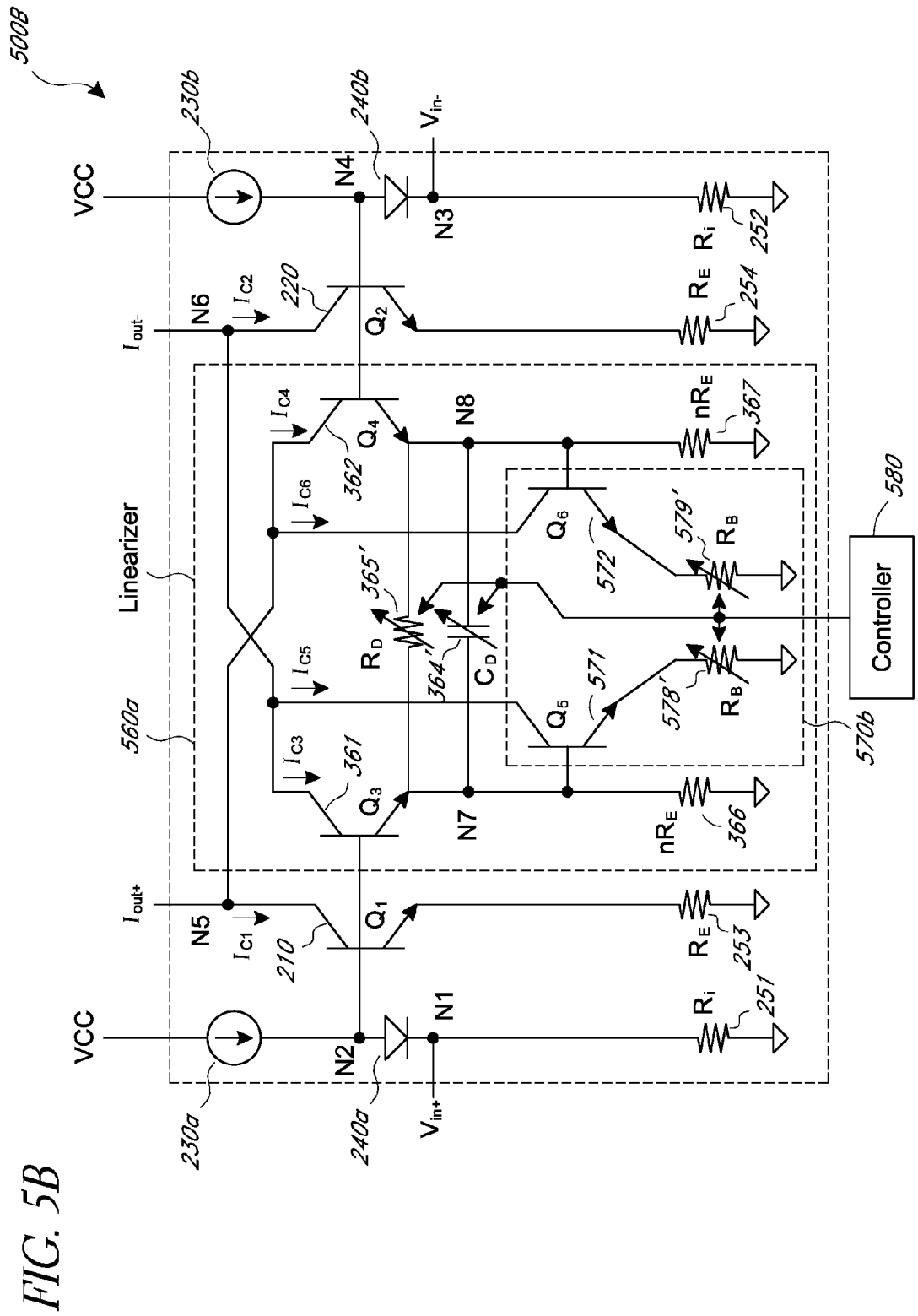
FIG. 5B is a schematic circuit diagram of a transconductance amplifier having a linearizer with a current booster according to yet another embodiment.

Referring to FIG. 5B, yet another embodiment of a transconductance amplifier having a linearizer and a current booster will be described below. The illustrated transconductance amplifier 500B includes first and second transistors 210, 220, first and second current sources 230a, 230b, first and second diodes 240a, 240b, first to fourth resistors 251-254, and first to sixth nodes N1-N6. The details of these components can be as described earlier in connection with those of FIG. 5A.

The transconductance amplifier 500A is further provided with a linearizer 560b that includes a third transistor 361, a fourth transistor 362, a first capacitor 364', a fifth resistor 365', sixth and seventh resistors 366, 367, and seventh and eighth nodes N7, N8. The details of the foregoing components of the linearizer 560b can be as described above in connection with those of the linearizer 560a of FIG. 5A except that the first capacitor 364' has a variable capacitance, and that the fifth resistor 365' has a variable resistance.

The transconductance amplifier 500B is also provided with a current booster 570b that includes a fifth transistor 571, a sixth transistor 572, an eighth resistor 578', and a ninth resistor 579'. The details of the foregoing components of the booster 570b can be as described above in connection with those of the booster 570a of FIG. 5A except that each of the eighth resistor 578' and the ninth resistor 579' has a variable resistance.

The amplifier 500B can also be provided with a controller 580 to control the capacitance of the first capacitor 364' and/or the resistance of the fourth, eighth, and ninth resistors 365', 578', 579'. The controller 580 may be programmed to provide an appropriate level of the collector currents $I_{C5}$, $I_{C6}$ of the fifth and sixth transistors 571, 572 to effectively provide linear response for a large signal swing. Further, the controller 580 may be programmed to provide an adequate capacitance to match the phase of the collector currents $I_{C3}$, $I_{C4}$ of the third and fourth transistors 361, 362 with that of the collector currents $I_{C1}$, $I_{C2}$ of the first and second transistors 210, 220 for effective linearization. The controller 580 may also be programmed to control the gain of the amplifier 500B by controlling the resistance $R_D$ of the fifth resistor 365'.

The controller 580 can be programmed during manufacturing of the amplifier, or programmed to operate on the fly, depending on the needs. A skilled artisan will appreciate that various types of controllers can be adapted for use as the controller 580.

Figure 6:
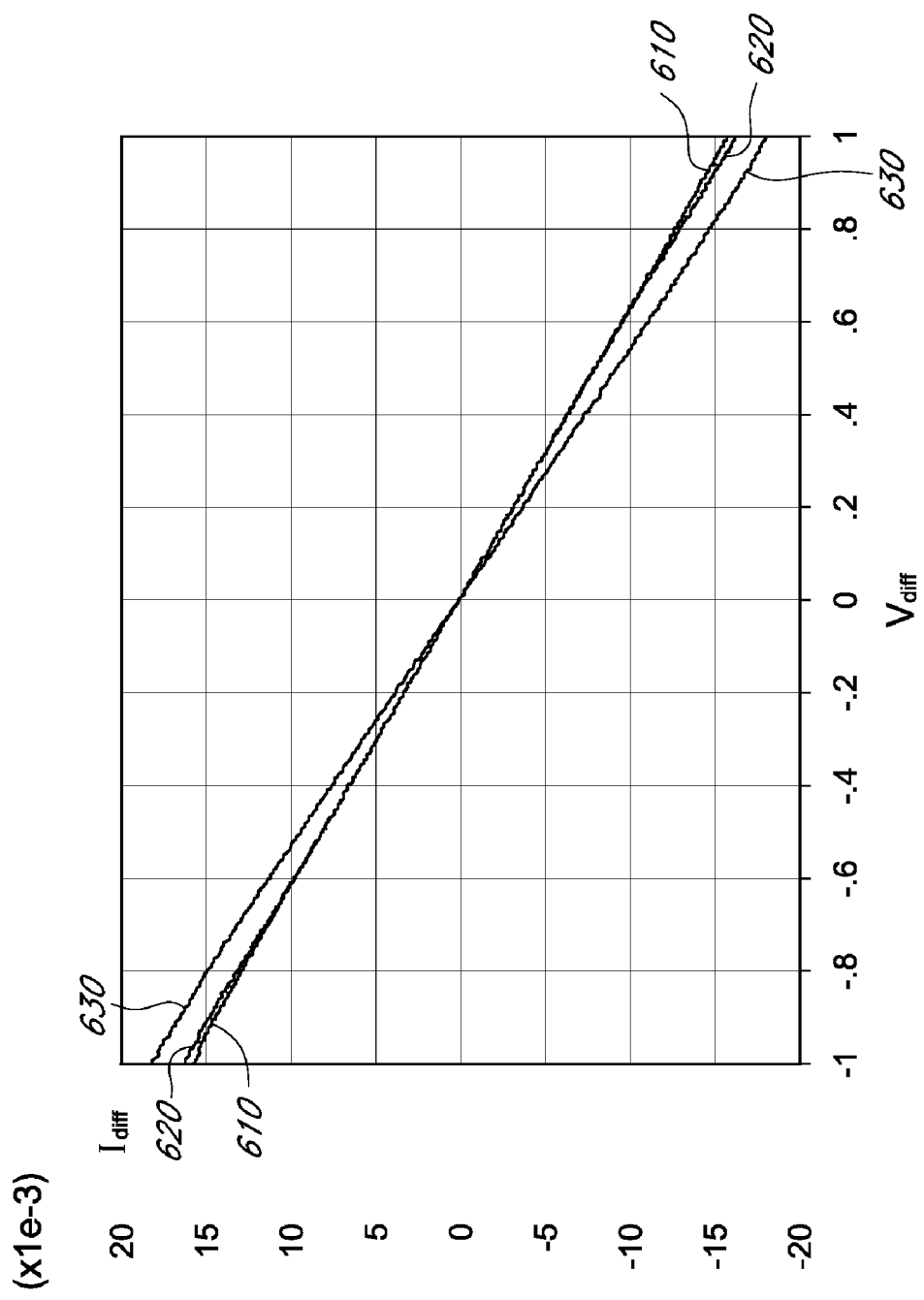
FIG. 6 is a graph illustrating relationships among the transconductances of the amplifiers of FIGS. 2, 3, and 5A.
Figure 7:
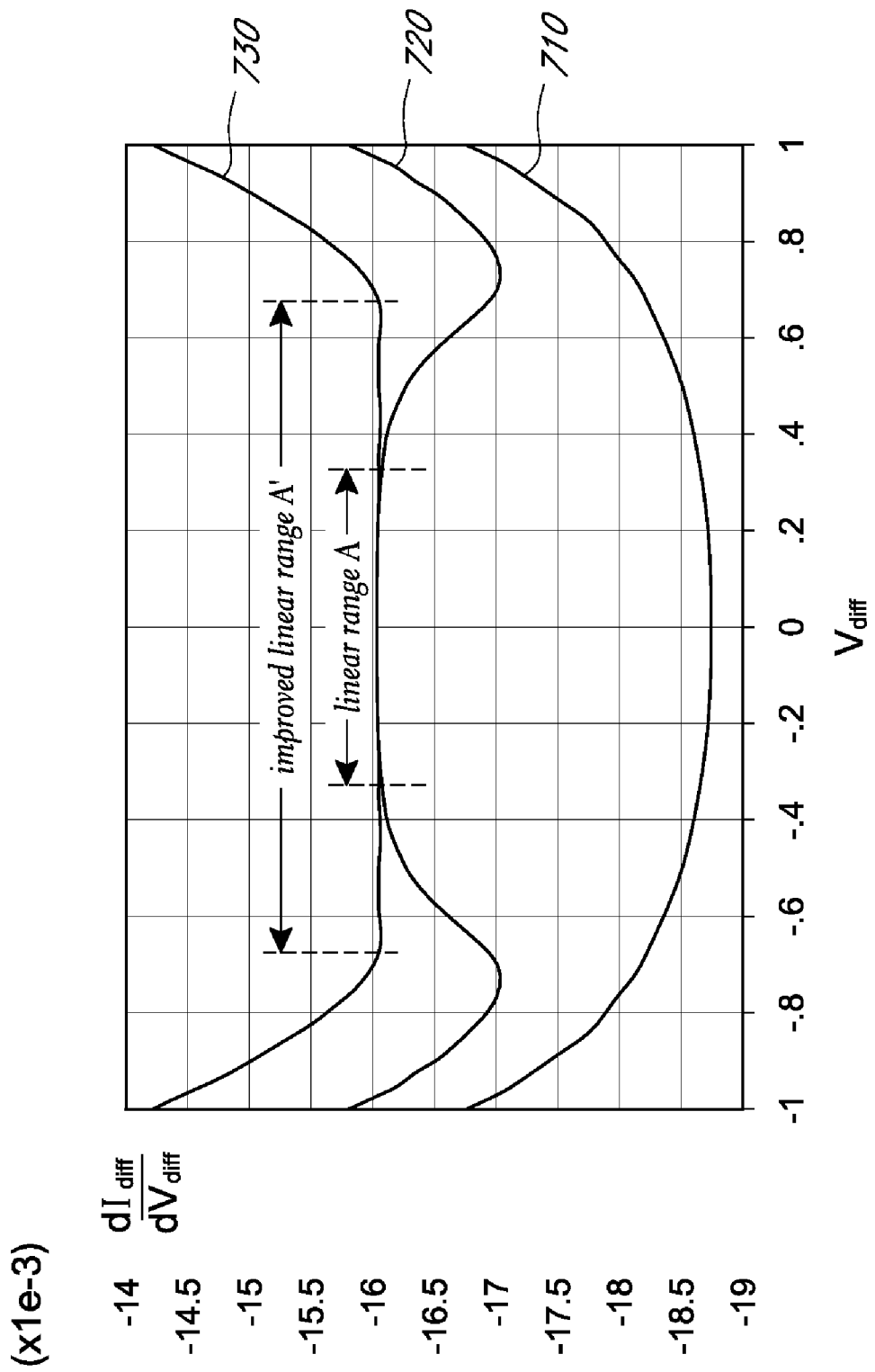
FIG. 7 is a graph illustrating relationships among the derivatives of the transconductances of the amplifiers of FIGS. 2, 3, and 5A.

Referring to FIGS. 6 and 7, an improvement by the current boosters of FIGS. 5A and 5B to the linearity of the amplifier response will be described below. In FIG. 6, the x-axis represents an input differential voltage $V_{diff}$, that is, a voltage difference between the first and second input voltages ($V_{diff}=V_{in+}-V_{in-}$). The y-axis represents an output differential current $I_{diff}$, that is, a current difference between the first and second output currents ($I_{diff}=I_{out+}-I_{out-}$).

In FIG. 6, a first line 610 represents $I_{diff}/V_{diff}$ of the transconductance amplifier 200 of FIG. 2 without a linearizer and a current booster. A second line 620 represents $I_{diff}/V_{diff}$ of the transconductance amplifier 300 of FIG. 3 with a linearizer, but without a booster. A third line 630 represents $I_{diff}/V_{diff}$ of the transconductance amplifier 500A of FIG. 5A with a linearizer and a booster.

In FIG. 7, the x-axis represents an input differential voltage $V_{diff}$, as described above in connection with FIG. 6. The y-axis represents the first derivative of an output differential current $I_{diff}$, that is, $dI_{diff}/dV_{diff}$, which indicates changes in the slope of the lines 610-630. In FIG. 7, a first line 710 represents $dI_{diff}/dV_{diff}$ of the transconductance amplifier 200 of FIG. 2. A second line 720 represents $dI_{diff}/dV_{diff}$ of the transconductance amplifier 300 of FIG. 3. A third line 730 represents $dI_{diff}/dV_{diff}$ of the transconductance amplifier 500A of FIG. 5A.

In FIG. 6, the second line 620 has a very slight deviation from the first line 610, and thus it is not that apparent that the linearity of the second line 620 illustrates an improvement to the linearity of the first line 610. However, FIG. 7 shows that the first line 710 has a bowl shape, which is indicative of the changes of the slope of the first line 610 across the illustrated voltage range between about −1 V and about +1 V. FIG. 7 further shows that the second line 720 is horizontal within a range between about −0.3V and about +0.3V, which is denoted as linear range A. Within this linear range A, as the derivative $dI_{diff}/dV_{diff}$ is constant, the slope of the second line 620 of FIG. 6 does not change, and thus the second line 620 is linear. However, outside the linear range A, the line 720 has steep decreases and increases, which indicate non-linearity of the second line 620.

The third line 630 of FIG. 6 shows that the current booster (for example, 570a of FIG. 5A) pulls down the differential output current $I_{diff}$ to be more negative than the second line 620 as the differential input signal $V_{diff}$ increases, or pulls up the differential output current $I_{diff}$ to be more positive than the second line 620 as the differential input signal $V_{diff}$ decreases.

The third line 730 of FIG. 7 shows how such operation improves the linearity of the amplifier response. The horizontal portion of the third line 730 expands outside the linear range A of the line 720, thus providing a wider linear range A' between about −0.7 V and about +0.7 V. Thus, even with a (differential) signal swing as large as ±0.7 V, the amplifier 500A of FIG. 5A can provide a substantially linear response.

As described above, the embodiments described above can provide an improved linearity over a wider input range. Further, the current booster adds relatively little noise, and thus provides improved dynamic range.

Applications

The improved transconductance amplifiers of the embodiments can be used in various applications, including, but not limited to, mixers, modulators, or demodulators in wireless communications. In one embodiment, the booster can provide an improvement that can be as much as, for example, about 6 dB in Adjacent Channel Power Ratio (ACPR) for a combination of a digital-to-analog converter (DAC) and an Analog Quadrature Modulator (AQM).

A skilled artisan will appreciate that the configurations and principles of the embodiments can be adapted for any other circuits. The circuits employing the above described configurations can be implemented into various electronic devices or integrated circuits. Examples of the electronic devices can include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a transconductance amplifier having an inverted input and a non-inverted input configured to receive a differential input voltage signal and having an inverted output and a non-inverted output configured to generate a differential output current signal at least partly in response to the differential input voltage signal;
a linearizer configured to remove non-linearity in the differential output current signal such that the differential output current signal is substantially linear when the differential input voltage signal is within a range, wherein the linearizer includes a non-inverted input electrically coupled to the non-inverted input of the transconductance amplifier and a non-inverted output electrically coupled to the inverted output of the transconductance amplifier, and wherein the linearizer further includes an inverted input electrically coupled to the inverted input of the transconductance amplifier and an inverted output electrically coupled to the non-inverted output of the transconductance amplifier; and
a current booster configured to add a current to the differential output current signal such that the differential output current signal remains substantially linear when the differential input voltage signal is outside the range.

2. An apparatus comprising:
a transconductance amplifier having an input configured to receive an input voltage signal and having an output configured to generate an output current signal at least partly in response to the input voltage signal;
a linearizer configured to remove non-linearity in the output current signal such that the output current signal is substantially linear when the input voltage signal is within a range; and
a current booster configured to add a current to the output current signal such that the output current signal remains substantially linear when the input voltage signal is outside the range,
wherein the current booster is configured to not add the current when the input voltage signal is within the range.

3. An apparatus comprising:
a transconductance amplifier having an input configured to receive an input voltage signal and having an output configured to generate an output current signal at least partly in response to the input voltage signal;
a linearizer configured to remove non-linearity in the output current signal such that the output current signal is substantially linear when the input voltage signal is within a range; and a current booster configured to add a current to the output current signal such that the output current signal remains substantially linear when the input voltage signal is outside the range, wherein the amplifier is configured to receive an input voltage signal that comprises a first input voltage signal and a second input voltage signal that together form a differential input signal, and wherein the amplifier is further configured to generate an output current signal that comprises a first output current signal and a second output current signal that together form a differential output signal, wherein the transconductance amplifier comprises:

a first transistor having an emitter electrically coupled to a common voltage reference, a base configured to receive the first input voltage signal, and a collector configured to output the first output current signal;

a second transistor having an emitter electrically coupled to the common voltage reference, a base configured to receive the second input voltage signal, and a collector configured to output the second output current signal;

a first amplifier resistor electrically coupled between the emitter of the first transistor and the common voltage reference; and a second amplifier resistor electrically coupled between the emitter of the second transistor and the common voltage reference.

4. The apparatus of claim 3, wherein the linearizer comprises:

a third transistor having an emitter electrically coupled to the common voltage reference, a base configured to receive the first input voltage signal, and a collector electrically coupled to the collector of the second transistor; and a fourth transistor having an emitter electrically coupled to the common voltage reference, a base configured to receive the second input voltage signal, and a collector electrically coupled to the collector of the first transistor.

5. The apparatus of claim 4, wherein the linearizer further comprises:

a first linearizer resistor electrically coupled between the emitter of the third transistor and the common voltage reference; and a second linearizer resistor electrically coupled between the emitter of the fourth transistor and the common voltage reference, wherein each of the first and second amplifier resistors has a first resistance, and wherein each of the first and second linearizer resistors has a second resistance that is n times the first resistance, with n having a value greater than 1.

6. The apparatus of claim 4, wherein the linearizer further comprises:

a first current source electrically coupled between the emitter of the third transistor and the common voltage reference; and a second current source electrically coupled between the emitter of the fourth transistor and the common voltage reference.

7. The apparatus of claim 4, wherein the linearizer further comprises one or more capacitors electrically coupled between the emitters of the third and fourth transistors, and a linearizer resistor electrically coupled between the emitters of the third and fourth transistors.

8. The apparatus of claim 7, wherein the one or more capacitors have a variable capacitance, and wherein the third linearizer resistor has a variable resistance.

9. The apparatus of claim 4, wherein the current booster comprises:

a fifth transistor having an emitter electrically coupled to the common voltage reference, a base electrically coupled to the emitter of the third transistor, and a collector electrically coupled to the collector of the second transistor; and a sixth transistor having an emitter electrically coupled to the common voltage reference, a base electrically coupled to the emitter of the fourth transistor, and a collector electrically coupled to the collector of the first transistor.

10. The apparatus of claim 9, wherein the linearizer further comprises:

a first booster resistor electrically coupled between the emitter of the fifth transistor and the common voltage reference; and a second booster resistor electrically coupled between the emitter of the sixth transistor and the common voltage reference.

11. The apparatus of claim 10, wherein the first and second booster resistors have a variable resistance.

12. The apparatus of claim 11, further comprising a controller configured to control the variable resistances of the first and second booster resistors.

13. The apparatus of claim 9, wherein the input voltage signal comprises a differential signal, wherein the range is between a first voltage and a second voltage, the second voltage being higher than the first voltage, wherein the fifth transistor is turned on, and the sixth transistor is turned off when the input voltage signal is higher than the second voltage, and wherein the fifth transistor is turned off, and the sixth transistor is turned on when the input voltage signal is lower than the first voltage.

14. An electronic device comprising:

a transconductance amplifier configured to receive a differential input voltage signal comprising a non-inverted input voltage signal and an inverted input voltage signal, and wherein the transconductance amplifier is further configured to generate a differential output current signal comprising a non-inverted output current signal and an inverted output current signal, the transconductance amplifier comprising:

a first transistor configured to convert the non-inverted input voltage signal into the non-inverted output current signal, wherein the non-inverted output current signal comprises an undistorted component and distortion terms;

a second transistor configured to receive the inverted input voltage signal and to provide a cancellation current to the non-inverted output current signal such that at least one distortion term of the distortion terms is substantially cancelled out when the differential input voltage signal is within a first input voltage range; and a third transistor configured to provide an additional current to the non-inverted output current signal such that the response of the amplifier remains linear outside the first input voltage range.

15. The device of claim 14, wherein the third transistor is configured to provide a current having a larger amplitude as a magnitude of the differential input voltage signal increases.

16. The device of claim 14, wherein the at least one term comprises a third order distortion term.

17. The device of claim 14, wherein the first transistor has an emitter electrically coupled to a common voltage reference, a base configured to receive the non-inverted input voltage signal, and a collector configured to output the non-inverted output current signal, wherein the second transistor has a base configured to receive the inverted input voltage signal, and a collector electrically coupled to the collector of the first transistor; and wherein the third transistor has a base electrically coupled to the emitter of the second transistor, and a collector electrically coupled to the collector of the first transistor.

18. A method for linearizing an amplifier, the method comprising:

converting, by a transconductance amplifier having an inverted input, a non-inverted input, an inverted output, and a non-inverted output, a differential input voltage signal into a differential output current signal, wherein the differential output current signal contains non-linearity relative to the differential input voltage signal;

cancelling, by a linearizer having an inverted input, a non-inverted input, an inverted output, and a non-inverted output, the non-linearity of the differential output current signal such that the differential output current signal is linear when the differential input voltage signal is within a first voltage range, wherein the non-inverted and inverted inputs of the linearizer are electrically coupled to the non-inverted and inverted inputs of the transconductance amplifier, respectively, and wherein the inverted and non-inverted outputs of the linearizer are electrically coupled to the non-inverted and inverted outputs of the transconductance amplifier, respectively; and linearizing the differential output current signal when the differential input voltage signal is outside the first voltage range.

19. The method of claim 18, wherein linearizing the differential output current signal comprises adding a current to the differential output current signal only when the differential input voltage signal is outside the first voltage range.

20. The method of claim 18, wherein cancelling the non-linearity comprises adding a cancellation current to the differential output current signal, and wherein linearizing the differential output current signal comprises adding an additional current to the differential output current signal.

21. An apparatus comprising:

means for converting a differential input voltage signal into a differential output current signal, wherein the converting means includes an inverted input, a non-inverted input, an inverted output, and a non-inverted output, wherein the differential output current signal contains non-linearity relative to the differential input voltage signal;

means for cancelling the non-linearity of the differential output current signal such that the differential output current signal is linear when the differential input voltage signal is within a first voltage range, wherein the cancelling means includes an inverted input, a non-inverted input, an inverted output, and a non-inverted output, wherein the non-inverted and inverted inputs of the cancelling means are electrically coupled to the non-inverted and inverted inputs of the converting means, respectively, and wherein the inverted and non-inverted outputs of the cancelling means are electrically coupled to the non-inverted and inverted outputs of the converting means, respectively; and means for linearizing the differential output current signal when the differential input voltage signal is outside the first voltage range.

* * * * *